United States Patent
Ni et al.

(10) Patent No.: US 8,577,666 B2
(45) Date of Patent: Nov. 5, 2013

(54) CLOCK SYNCHRONIZATION IN A MODULAR CIRCUIT EMULATION SYSTEM

(75) Inventors: Hualiang Ni, Markham (CA); Ahmad R. Moghaddam, North York (CA); Cecil E. King, Mississauga (CA)

(73) Assignee: ViXS Systems, Inc., Toronto, Ontario (CA)

( * ) Notice: Subject to any disclaimer, the term of this patent is extended or adjusted under 35 U.S.C. 154(b) by 667 days.

(21) Appl. No.: 12/764,677

(22) Filed: Apr. 21, 2010

(65) Prior Publication Data

US 2011/0264436 A1  Oct. 27, 2011

(51) Int. Cl.
 *G06F 9/455* (2006.01)
(52) U.S. Cl.
 USPC .................................. 703/23; 703/13; 703/28
(58) Field of Classification Search
 USPC .............. 703/13, 14, 19, 23, 24, 28
 See application file for complete search history.

(56) References Cited

U.S. PATENT DOCUMENTS

| | | | | |
|---|---|---|---|---|
| 6,701,418 B2 * | 3/2004 | Poletto et al. | | 711/147 |
| 7,120,571 B2 * | 10/2006 | Shei et al. | | 703/23 |
| 7,424,416 B1 * | 9/2008 | Cavanagh et al. | | 703/13 |
| 7,590,211 B1 * | 9/2009 | Burney | | 375/376 |
| 7,715,467 B1 * | 5/2010 | Burney | | 375/219 |
| 7,746,251 B2 * | 6/2010 | Gonzalez | | 341/100 |
| 7,855,969 B2 * | 12/2010 | Vogel et al. | | 370/242 |
| 7,948,260 B1 * | 5/2011 | Shilshtut | | 326/9 |
| 2009/0259878 A1 * | 10/2009 | Remlin et al. | | 713/600 |
| 2011/0251836 A1 * | 10/2011 | Wang et al. | | 703/28 |

OTHER PUBLICATIONS

Application Note SCAA045, "Design and Layout Guidelines for the CDCVF2505 Clock Driver", Texas Instruments, Nov. 2000, 15 pages.*

* cited by examiner

*Primary Examiner* — Omar Fernandez Rivas
*Assistant Examiner* — Herng-Der Day
(74) *Attorney, Agent, or Firm* — Garlick & Markison; Bruce E. Stuckman

(57) ABSTRACT

A modular circuit emulation system includes a global clock generator that generates a plurality of clock signals. A plurality of emulation boards each include at least one programmable circuit and a clock buffer. The clock buffer generates at least one synchronized clock signal for clocking the programmable circuit or circuits, based on at least one of the plurality of global clock signals.

16 Claims, 7 Drawing Sheets

CLOCK SYNCHRONIZATION IN A MODULAR CIRCUIT EMULATION SYSTEM

CROSS REFERENCE TO RELATED PATENTS

The present application is related to the U.S. application entitled, MODULAR CIRCUIT EMULATION SYSTEM, having Ser. No. 12/764,671, filed on Apr. 21, 2010.

TECHNICAL FIELD OF THE INVENTION

The present invention relates to circuit emulators for emulating an integrated circuit.

DESCRIPTION OF RELATED ART

An emulation system is used to test an integrated circuit design, such as an application specific integrated circuit (ASIC), before it is fabricated. The emulation system generally includes a field programmable gate array (FPGA) that is programmed to mimic the functionality of a circuit to be tested. Debugging an integrated circuit via emulation saves costs and lost time in changing or patching a faulty design. The increasing scale and complexity of ASIC products requires an emulation system capable of meeting the verification demands for such products. Emulation products are available from companies such as DiniGroup and Hardi, along with more advanced co-verification systems from Cadence and Eve.

Existing emulation systems suffer from limitations such as inadequate support for certain types of I/O peripherals, and flexibility in terms of capacity. Another problem with currently available products is their run speeds. Typically, to run reliably, they need to be run in frequencies less than 1-3 MHz. While this speed is somewhat faster than software simulation-based solutions, it is still much slower than most actual ASIC designs.

Further limitations and disadvantages of conventional and traditional approaches will become apparent to one of ordinary skill in the art through comparison of such systems with the present invention.

DETAILED DESCRIPTION OF THE INVENTION INCLUDING THE PRESENTLY PREFERRED EMBODIMENTS

Figure 1:
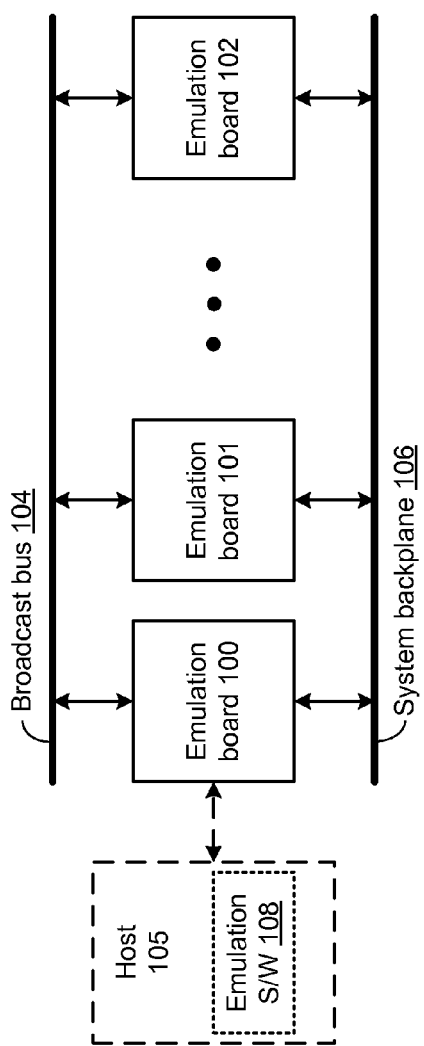
FIG. 1 presents a block diagram representation of a modular circuit emulation system 110 in accordance with an embodiment of the present invention.

FIG. 1 presents a block diagram representation of a modular circuit emulation system 110 in accordance with an embodiment of the present invention. A modular and highly scalable system is presented that is easily expandable to meet the capacity requirement of ever growing ASIC products. In particular, the modular circuit emulation system 110 includes a plurality of emulation boards (100, 101, 102, . . . ) that each include at least one programmable circuit such as an FPGA or other programmable logic device. A broadcast bus 104 provides a conduit to broadcast data from one of the emulation boards (100, 101, 102, . . . ) to the other emulation boards. A system backplane 106 is included that has a switching matrix that selectively couples the plurality emulation boards to one another.

In an embodiment of the present invention, the emulation boards (100, 101, 102, . . . ) include a plurality of homogenous modular boards that, for instance, differ only based on their device configuration and the peripherals attached thereto. One of the emulation boards, such as emulation board 100, serves as a master board that is normally connected to a host 105 that executes host software. The master board 100 is attached to peripherals that provide memory resources, a host interface and global clocks for the system, etc. Typically, host 105 can be a PC and it is connected to the emulation system via a PCI peripheral on emulation board 100. While a system with three emulation boards 100, 101 and 102 is illustrated, a greater number of emulation boards (100, 101, 102, . . . ) can be included for large designs or as few as a single emulation board can be used to focus on a few functions in isolation.

Further details regarding the implementation of the modular circuit emulation system 110 including several optional functions and features are described in conjunction with FIGS. 2-10 that follow.

Figure 2:
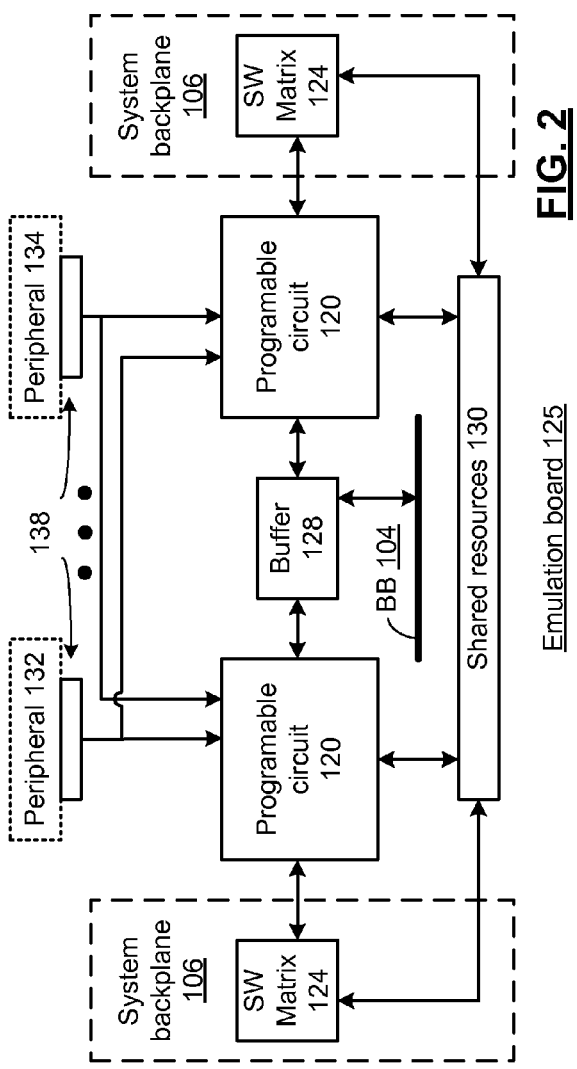
FIG. 2 presents a block diagram representation of an emulation board 125 in accordance with an embodiment of the present invention.

FIG. 2 presents a block diagram representation of an emulation board 125 in accordance with an embodiment of the present invention. In particular, an emulation board 125, such as emulation board (100, 101, 102 . . . ) is illustrated that includes a pair of programmable logic circuits 120, switch matrices 124, shared resources 130, buffers 128 and optional clock source 136.

In an embodiment of the present invention, the programmable circuits 120 are each implemented via FPGAs such as the Xilinx Virtex-5 XC5VLX330 FPGAs. The shared resources 130 can include on-board power regulation, optional memory resources and other resources used to support the programmable logic circuits 120 and/or to provide other control and coordination for the operation of the board. In particular, the shared resources 130 can include a third smaller FPGA, such as the Xilinx Spartan XC3S1400A. One task of the shared resources is the control of the switch matrices 124 as will be described in greater detail in conjunction with FIGS. 4-5.

In an embodiment of the present invention, the system backplane 106 includes two isolated data paths. These two isolated data paths include a first backplane for selectively coupling the right hand programmable circuit 120 of emulation board 125 to one or more the right hand programmable circuits 120 of other emulation boards and a second backplane for coupling to the left hand programmable circuit 120 of emulation board 125 to one or more the left hand programmable circuits 120 of other emulation boards.

As discussed in conjunction with FIG. 1, the emulation boards 125 can be implemented via a homogenous design with assembly options to configure the board according to the system or peripheral requirements. In operation, the system backplane 106 provides connectivity between the programmable circuits 120 of emulation boards 125.

The broadcast bus 104 is very different from the backplane described above. Its objective is to provide common connections between all programmable circuits 120 in the system. As the name suggests, broadcast signaling can originate from one FPGA and is received by all other FPGAs. There is no restriction on which FPGA initiates a broadcast message. Broadcast bus signals are also useful in situations where a "crossover" signal is required. This is the most efficient way to provide access from one programmable circuit 120 on an emulation board 125 to a FPGA on the opposite side of a different board.

Buffers 128 include buffers for coupling between programmable circuits 120 on the same emulation board 125, buffering of broadcast bus signals received via broadcast bus 104 and in particular, the buffering of global clock signals used to synchronize trigger events for the ASIC hardware. Further details regarding clocking is presented in conjunction with FIGS. 6 and 7.

Peripheral connectors, such as card slots 138, provide dedicated connectivity to optional peripheral cards 132 and 134. Peripheral cards/boards are inserted into these dedicated slots 138. This type of architecture is useful because any function, such as an interface for the ASIC, can be designed on inexpensive boards with hardware specific for that function, using dedicated FPGA I/Os connected to the peripheral slot connectors. This avoids the need to modify the design of emulation board 125 to meet a certain peripheral requirement. The design of emulation board 125 and peripheral boards 132 and 134 can be viewed as independent designs that come together at the connectors 138.

While two peripheral card slots 138 are shown, each emulation board can include a greater number of peripheral card slots 138 to, for example, accept eight or more peripherals. It should be noted that peripheral cards may or may not use up all or even most of the FPGA I/Os available to them. Examples of peripherals include:

| | |
|---|---|
| DDR2/DDR3 Memory | PCI Interface |
| Clock Sources | 10/100/1000 Ethernet |
| Dual UART | Analog Video Input |
| Digital Video Output | NAND/NOR Flash Memory |
| PCIe Interface | USBD/USBH |
| Transport Stream I/O | Display Output |
| SPI/I2C Interface | Debug Peripheral |
| SD/MMC Memory | SmartCard Peripheral |
| HDMI/656 Output | SATA Interface |
| PCIeHost Interface | RS232/JTAG Interface |

In an embodiment of the present invention, the peripheral cards 132, 134 draw their power from the emulation board and particularly, its power source. The peripheral connectors can support, for example, 2 independent voltage rails, one for peripheral/FPGA I/O, and one that can be used locally by the peripheral. 32 pins spread evenly across the connector, 16 per voltage rail, provide enough current for most applications. There can also be one or more pins, for example 8 pins, on the peripheral connectors reserved for clock sources.

Figure 3:
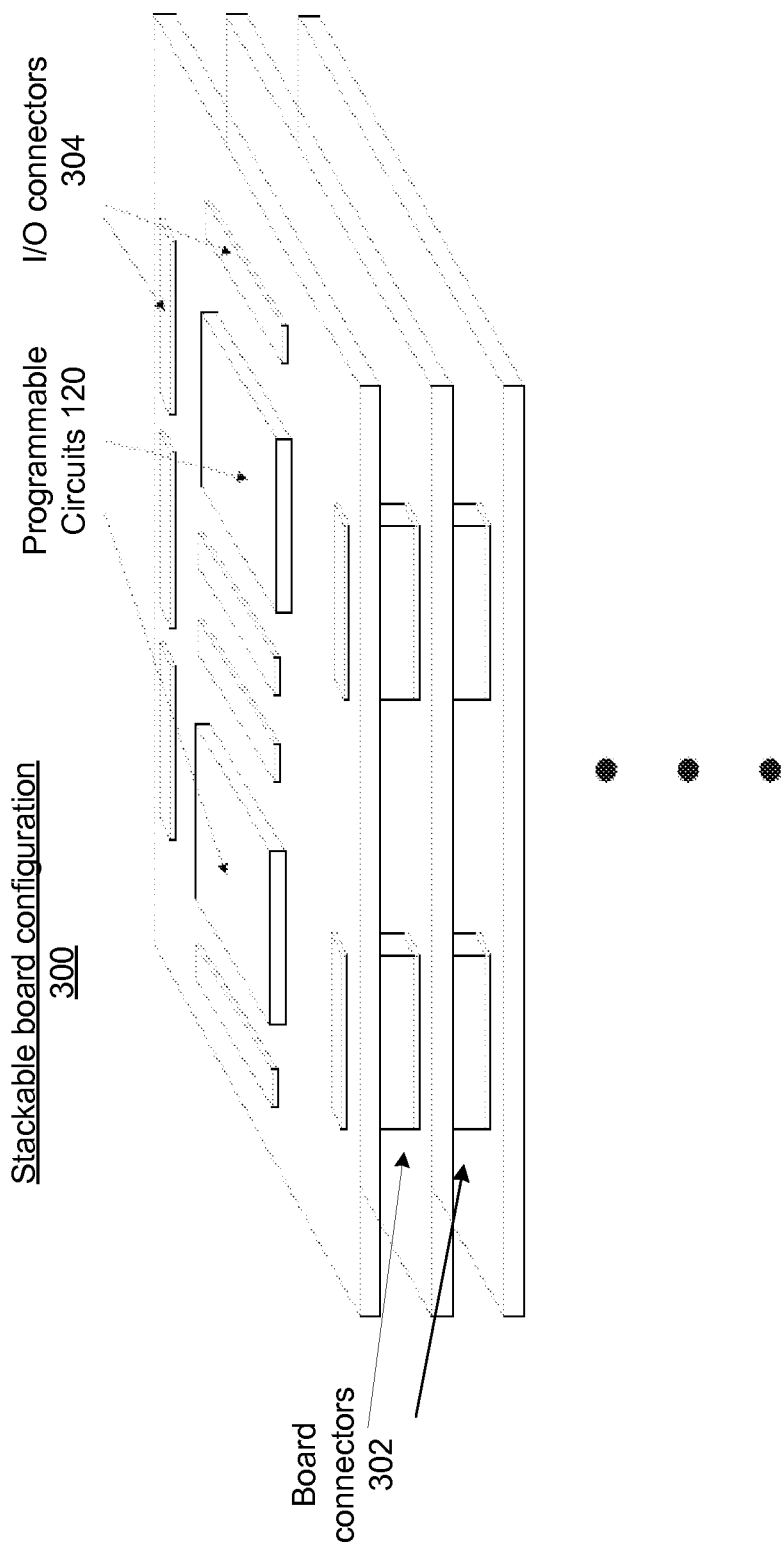
FIG. 3 presents a pictorial representation of a stackable board configuration in accordance with an embodiment of the present invention.

FIG. 3 presents a pictorial representation of a stackable board configuration 300 in accordance with an embodiment of the present invention. In particular, three emulation boards, such as emulation board 125, are shown that are stacked based on a plurality of board connectors 302 so as to be plugged one on top of another together in a "stacked" formation. These board connectors 302 can be implemented via high frequency connectors that surround each of the two programmable circuits 120 and bind the boards together to constitute the medium through which FPGA I/Os on different emulation boards 125 can be connected as part of the system backplane 106. As discussed in conjunction with FIG. 2, optional peripheral boards plug into other dedicated connectors 304 to provide internal support circuitry such as clocks and memory, or interfaces such as Gigabit Ethernet or a USB Host. In particular, 120-pin Samtec connectors, such as connectors 304 on each board can be used for connecting various I/O peripherals to the emulation boards 125. Other headers or connectors can be provided to connect the broadcast bus 104 to each board as well as external power, etc. By providing interconnection resources between boards, such as the system backplane 106 and broadcast bus 104, the capacity of the modular circuit emulation system can be expanded by adding as many boards as required to fit the ASIC design, basically allowing for the design to grow without any concern on whether it will fit in the FGPA-based emulation system or not. In addition to this, the capacity can also be increased using the serialization scheme that will be described later. For example, a 15 million gate ASIC design can be emulated with a five board stackable structure.

While the prior description has focused on connecting a plurality of emulation boards 125 including a master board, other boards can be stacked in this configuration as well. For example, a diagnostic board can be coupled to one or more emulation boards 125. The diagnostic board is not used to directly emulate a circuit. Rather, the diagnostic board is used in the testing of individual emulation boards 125 boards, such as by checking a board's connections to adjacent boards. In an embodiment of the present invention, each board can be tested individually. In addition, the diagnostics board can provide an additional connection path between the two programmable circuits 120 on an emulation board 125 boards, therefore allowing a boundary scan test for diagnostics.

Further, a diagnostics board can also be used as a large inter-connect resource for emulation boards 125 to increase the number of signals that can be connected together between two programmable circuits 120. In particular, a stand-alone system can be implemented via a single emulation board 125 combined with a diagnostics board, which is stacked above or below the emulation board 125 to provide a wide FPGA-to-FPGA interconnect bus.

As discussed in conjunction with FIG. 1, one of the emulation boards is coupled, via a peripheral card, to a host 105. The host 105 executes emulation software 108 to model the hardware and allow for seamless translation of design from a circuit to be emulated (e.g. an ASIC) to the programmable circuits 120. The software can support boundary scans of emulation boards in single or stack configuration to permit most complete diagnostics of the system and complete debugging of any failures of any of the boards. In an embodiment of the present invention, the emulation software 108 extracts the inter-connections between programmable circuits 120 and assigns the RTL top-level I/Os to the available physical FPGA pins. This allows for scalable ASIC emulation platforms with configurable architecture on routing resources. This methodology is suitable for both I/O and logic intensive RTL designs requiring multiple FPGAs for verification purposes. In particular, the software abstracts out the emulation platform physical layout in a form that is convenient for laborious UCF generation purposes. The software utilizes the available resources and generates the required configuration states (jumper setting, switch configurations for switch matrices 124, etc.). The switch configuration states are represented in different forms suitable to be downloaded directly onto the shared resources 130 which control the state of various switch matrices 124 of system backplane 106 as well as broadcast buffers.

In an embodiment of the present invention, the emulation software 108 uses an interconnection verification and diagnostics methodologies and tools in accordance with IEEE standard 1149.1 However, the methodology decouples the I/O stimulation process from the interconnection validation stage. This methodology is apt for scalable ASIC emulation platforms with fixed structures in terms of JTAG compliant devices in the chain but handles considerable changes in terms of the I/O connectivities and routings. Another advantage of separating the I/O stimulation from inter-connection examination is to easily expand the coverage of the boundary I/O testing to electrical points/connectors interacting with external entities like peripherals or other daughter boards. To this end, additional passive components (e.g., diagnostics boards, cables) and the aforementioned methodology can be utilized simultaneously to provide a very precise diagnostics result and enabling the coverage of end points/connectors. Moreover, if the connections are configured by some JTAG compliant devices accessible through the chain, the test patterns are modified to constructs the desired geometry of the interconnections directly through the configuration controller (s) during the scan process.

Figure 4:
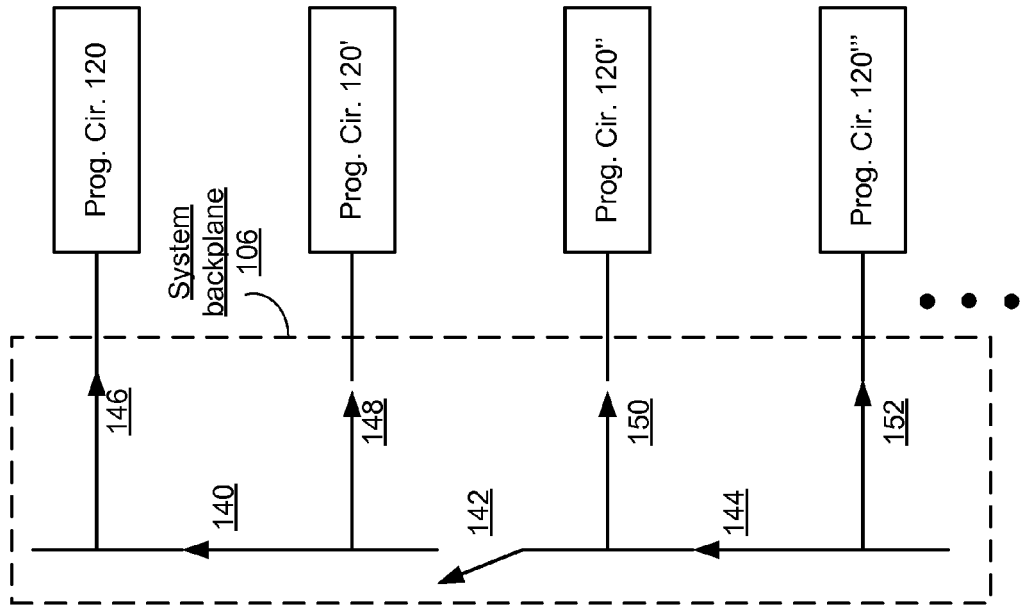
FIG. 4 presents a schematic block diagram representation of a system backplane 106 in accordance with an embodiment of the present invention.

FIG. 4 presents a schematic block diagram representation of a system backplane 106 in accordance with an embodiment of the present invention. One of the challenges of designing an emulation system is how to "increase" the number of available inter FPGA connections. The number of physical I/Os for a programmable circuit 120, such as a FPGA, is obviously fixed. The backplane 106 provides a structure to "increase" effective inter FPGA connections, relying on the fact that not all blocks programmed into two FPGAs need to connect to each other. FPGA I/Os not needed for interconnection can be configured for other purposes.

In an embodiment of the present invention, the board connectors 302 are used to form two separate vertical busses that run up and down through the board stack to provide connectivity for the backplane 106. The programmable circuits 120 on one side of each emulation board 125 have access to one vertical bus of backplane 106 and the programmable circuits 120 on the other side of each emulation board 125 have access to another, identical, vertical bus of backplane 106. The backplane can be, for instance, coupled to 640 FPGA I/Os, forming a 640-pin dedicated configurable backplane on each side of the modular circuit emulation system 110.

In addition, the backplane 106 includes a plurality of switches 140, 142, 144, 146 148, 150, and 152, such as zero delay analog switches included in switch matrix 124, to increase the availability of FPGA I/Os. The plurality of switches 140, 142, 144, 146 148, 150, and 152, effectively control the type of access between the programmable circuit 120 and the backplane 106 on an emulation board 125, and further determines whether or not the backplane 106 is continuous between boards. The plurality of switches 140, 142, 144, 146 148, 150, and 152, operate under control of a control unit, such as a small FPGA included in shared resources 130. In operation the plurality of switches 140, 142, 144, 146 148, 150, and 152, can selectively isolate the programmable circuit 120 of a particular emulation board from other emulation boards from the perspective of the backplane 106. For example, a programmable circuit 120 on a particular emulation board 125 may be connected, via the backplane 106, to programmable circuit 120 a board above or below that particular board or both boards or neither board. It should be noted that such isolation does not isolate other connectivity, such as via broadcast bus 104.

FIG. 4, in particular, illustrates a portion of one side of backplane 106 that selectively couples programmable circuits 120, 120', 120" and 120' from four different emulation boards 125. The switches 140, 142, 144 when open, create breaks in one of the vertical busses that make up one side of the backplane 106 between adjacent emulation boards 125. The switches 146, 148, 150 and 152, when open, isolate a programmable circuit 120, 120' or 120" on one side from all other programmable circuits on that side.

Figure 5:
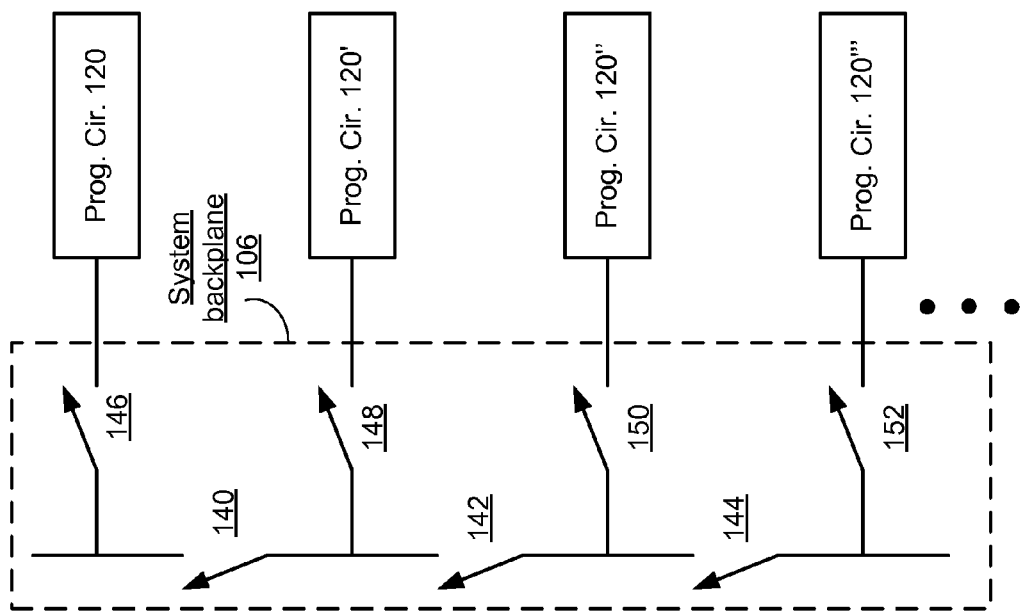
FIG. 5 presents a schematic block diagram representation of a system backplane 106 in accordance with an embodiment of the present invention.

FIG. 5 presents a schematic block diagram representation of a system backplane 106 in accordance with an embodiment of the present invention. A particular switch configuration is shown whereby programmable circuits pairs (120, 120') and (120", 120''') are coupled to one another via backplane 106, yet are decoupled from the other pair. The discontinuity in the backplane 106 created by leaving switch 142 open allows the same signal paths to be used for different signaling in different parts of the backplane 106. In the example shown, the signal paths formed by the connector between the boards containing programmable circuits 120 and 120' can be dedicated to connectivity between the programmable circuits 120 and 120'. Similarly, the signal paths formed by the connector between the boards containing programmable circuits 120" and 120''' can be dedicated to connectivity between the programmable circuits 120" and 120'''. By carefully partitioning the ASIC design to maximize the use of this feature, a kind of "virtual" backplane is created that allows two signals to share a single path in the backplane. This can be expanded even further if two additional emulation boards 125 are added to the emulation system stack to allow three signals on the same path (now broken in three). This technique takes advantage of situations where two FPGAs connect only to each other. There are other variations of this structure, such as "skipping" an emulation board in the stack to connect two FPGAs, or even connecting three adjacent FPGAs together that are isolated from two boards above or below the three. All of these configurations can be realized by relying on an intelligent partitioning of the ASIC design.

Figure 6:
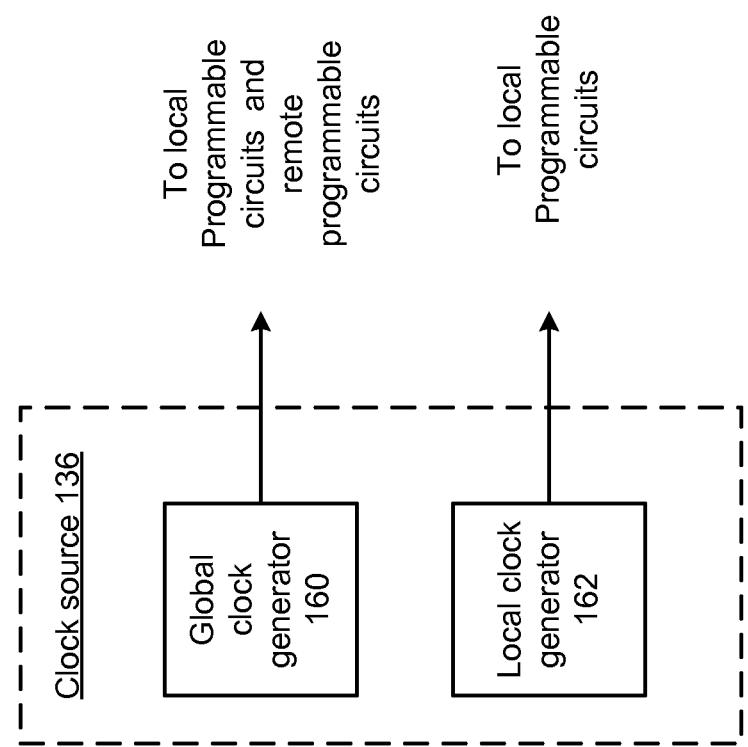
FIG. 6 presents a block diagram representation of a clock source 136 in accordance with an embodiment of the present invention.

FIG. 6 presents a block diagram representation of a clock source 136 in accordance with an embodiment of the present invention. In particular clock source 136 can be implemented as a peripheral card 132 or 134, that is connected to a peripheral card slot 138 on an emulation board 125, such as the master emulation board. The clock source 136 can include a global clock generator 160 that generates a plurality of clock signals for use by the particular emulation board 125 and for distribution to other emulation boards. In an embodiment of the present invention, the global clock source 160 generates eight global clock signals that are broadcast to all of the programmable circuits 120 of the modular circuit emulation system 110 via the broadcast bus 104. The broadcast bus provides eight independent clock channels.

The stacking nature of boards in the modular circuit emulation system 110 suggests that global clock skew might be an issue as the natural delays of signals propagating through connectors and jumpers accumulate, thus limiting the speed at which the system can operate. This can be mitigated somewhat by placing the clock sources at the centre of the stack. In an embodiment of the present invention, however, the global clock signals are "re-timed" via clock buffers included in buffer 128 on each board, meaning that the clocks are buffered when they are received before connecting them to that board's programmable circuits 120 and transmitting them to the next board to synchronize trigger events for the prototyped ASIC hardware. In particular, the clock buffers on each emulation board 125 edge align the global clock signals, allowing the modular circuit emulation circuit to be scalable and to operate with an arbitrary number of boards to implement large circuit emulation. In addition, the global clock signals from the clock source are balanced on each board so that they reach the two programmable circuits 120 at the same time.

While the description above is focused on global clock signals, the global clock source 136 in addition, or in the alternative, can include a local clock generator 162 for clocking used only on the emulation board 125 that hosts the peripheral card that includes the clock source 136. The local clock signals generated by the local clock source 162 can be used for clocking the programmable circuits 120, portions of the shared resources 130 or to provide other timing of a single emulation board 125.

As discussed, the modular circuit emulation system 110 can be implemented via a stackable architecture. A number of emulation boards can be stacked vertically to enable the emulation of a large design. On each board there are connectors that can accommodate a clock source 136 as a peripheral board. In a stack configuration, the peripheral board containing the clock source can feed its clocks to boards above and below it in the stack, so only one clock peripheral is required in the stack configuration. Provisions were also made so that the clocks are also balanced in the stack configuration, so that all FPGAs in the stack receive these peripheral clocks at the same time. To enable this clock balancing, clock buffers were used. These buffers can, for instance, operate at frequencies of 10 MHz or greater.

Figure 7:
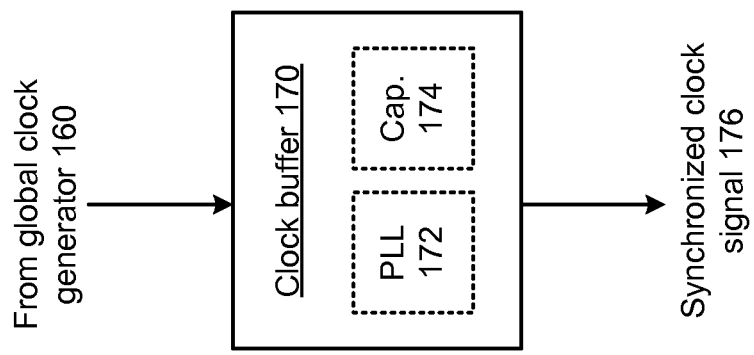
FIG. 7 presents a block diagram representation of a clock buffer 170 in accordance with an embodiment of the present invention.

FIG. 7 presents a block diagram representation of a clock buffer 170 in accordance with an embodiment of the present invention. The clock buffer 170, included in buffers 128, receives a global clock signal from global clock generator 160 and generates a synchronized clock signal 176 based on the global clock signal. When a number of global clock channels are used, each emulation board 125 can include a clock buffer 170 for each of the global clock channels used by that board. The clock buffers 170 each produce a synchronized clock signal 176 for a particular global clock channel that is edge aligned with the synchronized clock signal 176 of that particular global clock channel in use by the other boards.

In an embodiment of the present invention, the clock buffers 170 include a CY2305 buffer that is used to controlling the input/output delay through the use of an internal phase locked loop 172 (PLL) and small external capacitors 174. The CY2305's internal PLL works to align the edges of the buffer's feedback clock and its input. Adding capacitance to the feedback output, the clock buffer outputs can be made to "lead" the input in time. This provides the repeated clock signal (one of the "leading" outputs) with enough time to reach the next board's clock buffer input by the time the input clock edge on the first board occurs. When the clock buffer 170 inputs on adjacent boards are aligned in this manner, this can be extended to all other boards in both directions by applying the same load on every buffer feedback pin. This means that length-balanced FPGA clock input signals, which are also "leading" clock outputs of the buffer, are edge aligned with all FPGAs on all other boards. Fine tuning of any skew can be accomplished by adjustment of the trim-caps on a board-to-board basis.

Figure 8:
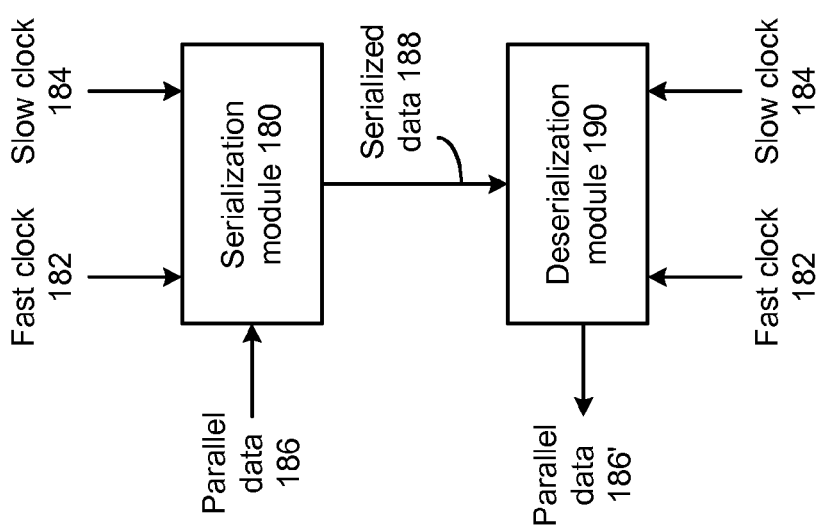
FIG. 8 presents a block diagram representation of a serialization module 180 and deserialization module 190 in accordance with an embodiment of the present invention.

FIG. 8 presents a block diagram representation of a serialization module 180 and deserialization module 190 in accordance with an embodiment of the present invention. As previously discussed, when performing hardware emulation, large designs often need to be split across multiple programmable circuits 120, such as multiple FPGAs. Consequently, you may require a large number of interconnections and in some cases, the number of required interconnections via backplane 106 may exceed the available I/O resources of the FPGA. Serialization can be used to reduce the required number of I/Os. Serialization works by performing parallel-to-serial conversion at the sending FPGA and serial-to-parallel conversion at the receiving FPGA. In particular, parallel data 186 (P-bits wide), a fast clock 182 and a slow clock 184 are fed to the serialization module 180. The serialization module 180 compresses the data by scale factor S. For example, if P is 40 and S is 4 then the output is 10 bits of serialized data 188. The fast clock 182 and slow clock 184 can be asynchronous. The fast clock 182 is F times faster than the slow clock 184, where F is greater than S. The parallel data 186 was generated by the slow clock 184 and is valid after the positive edge of the slow clock 184. The fast clock 182 samples the slow clock 184 to find its positive edge. Once detected, parallel data 186 is sampled and shifted out serially as serialized data 188. In an embodiment of the present invention, the serialized data 188 is accompanied by a start signal which indicates the first bit of the serialized data 188.

The serialized data 188 including the start bit are transmitted to the deserialization module 190 at the receiving FPGA. The deserialization module 190 runs from the fast clock 182 and the slow clock 184, it detects the start bit, accumulates the serial data, and outputs P bits of parallel data 186' at its output port. This serialization methodology does not make use of any buffering between the serialization/deserialization modules. The scale factor, F, of the rates between the fast clock 182 and the slow clock 184 can be chosen so that the serialization is transparent to the system running on the slow clock 184. In other words, data flopped on the positive edge of the slow clock 184 is serialized, sent to the receiving FPGA, and deserialized before the next positive edge of the slow clock 184. The system logic experiences no latencies due to serialization. As the signal travels up or down the stack it attenuates; in addition, there is also a propagation delay. The attenuation and propagation delays places a limit on the maximum frequency at which the stack can operate. This in turn will dictate the fast clock frequency used for serialization.

One advantage of this asynchronous approach versus synchronous approaches to serialization is that only one fast clock 182 is required for a design with multiple asynchronous clocks. If the fast clock 182 is chosen so that it is F times faster than the fastest slow clock 184, then it should also be suitable for all the other slow clocks 184. In synchronous approaches you'll need a synchronous fast clock 182 for each slow clock 184—using up additional digital clock manager (DCM) resources of the FPGA.

Figure 9:
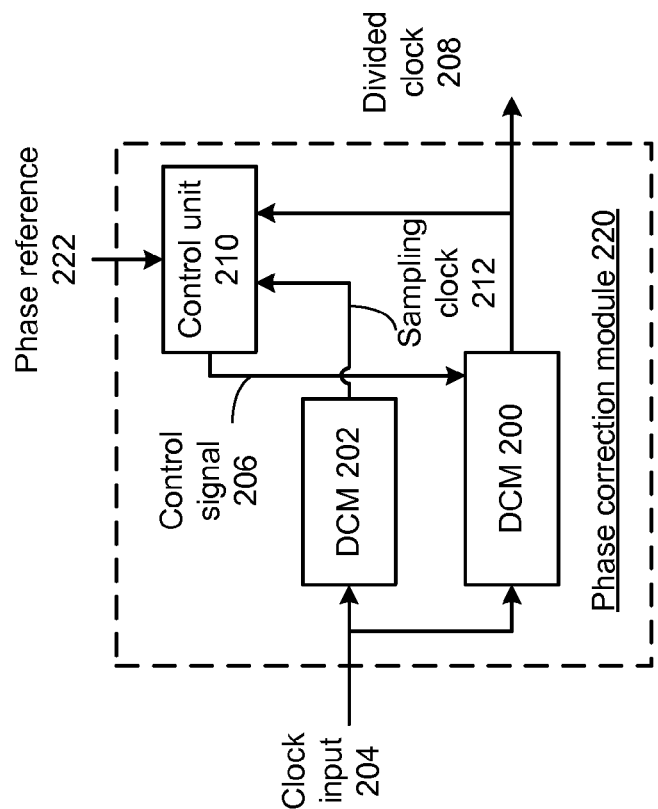
FIG. 9 presents a schematic block diagram representation of a phase correction module 220 in accordance with an embodiment of the present invention.

FIG. 9 presents a schematic block diagram representation of a phase correction module 220 in accordance with an embodiment of the present invention. The serialization method described in conjunction with FIG. 8 depends on the fast clock 182 of the sending FPGA being in-phase with the fast clock in the receiving FPGA. Similarly, the slow clock 184 in both FPGAs must also be in-phase. If the clocks can be distributed from a global clock generator 160 and buffered to edge alignment and balanced on the emulation board 125 then this condition would be satisfied. However this is not always possible for slow clock 184. The maximum slow clock frequency the system can support is maximum-clock-frequency/F. In some cases this result may be lower than the minimum clock frequency that the clock network can support. If the slow clocks 184 cannot be globally generated and distributed on-board then they need to be generated inside each FPGA, such as by division from a higher frequency clock source using a DCM. This can cause another problem—namely a divided clock in one FPGA may not be phase aligned with a divided clock in another FPGA.

The phase correction module 220 is included to address this issue. In particular, one 'master' FPGA distributes its slow clock 184 to all the other FPGAs. On the receiving FPGA, the received slow clock 184' is no longer phase aligned with the master FPGA because of the propagation delay. In the receiving FPGA, the phase correction module 220 generates a divided clock 208 from a global clock signal, clock input 204, via DCM 200. Initially, the divided clock 208 may or may not be in-phase with the slow clock 184 in the master FPGA. While received version of the slow clock 184' is not phase-aligned with the master FPGA, it is off by only a propagation delay. The control unit 210 compares the divided clock 208 with the phase reference slow clock 184' to determine whether the divided clock 208 is substantially phase aligned or phase inverted from the slow clock 184 in the master FPGA (off by only the maximum propagation delay). In particular, the control unit 210 samples the divided clock 208 and phase reference 184', based on sampling clock 212 generated by DCM 202 from clock input 204. If the clock phases are the substantially the same (off by less than the maximum propagation delay) the control unit 210 does not act. If the clocks are not in-phase (off by more than the maximum propagation delay), the clock unit 210 resets the DCM 200 by control signal 206 and tries again to generate a divided clock 208 that is in-phase with the phase reference 184. The control unit 210 repeats this process until the phase reference 184' and the divided clock 208 are substantially in-phase—indicating that the divided clock 208 and the slow clock 184 are in-phase.

In an embodiment of the present invention, the control unit 210 can be implemented using a single processing device, a shared processing device or a plurality of processing devices. Such a processing device may be a microprocessor, co-processors, a micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in a memory. Such a memory may be a single memory device or a plurality of memory devices. Such a memory device can include a hard disk drive or other disk drive, read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

Figure 10:
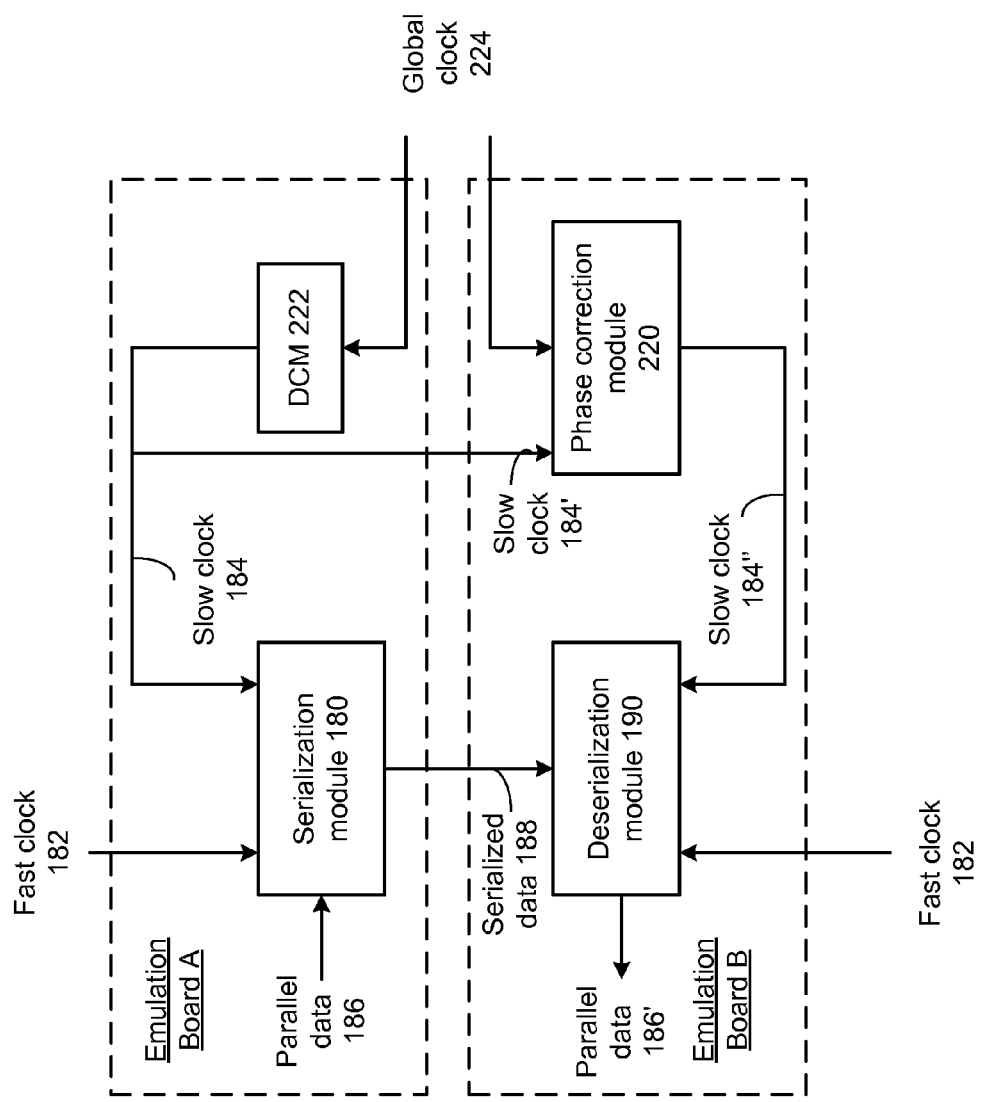
FIG. 10 presents a schematic block diagram representation of a serialization module 180 and deserialization module 190 in accordance with an embodiment of the present invention.

FIG. 10 presents a schematic block diagram representation of a serialization module 180 and deserialization module 190 in accordance with an embodiment of the present invention. In particular, the phase correction module 220 of FIG. 9 is incorporated into the design of FIG. 8 as follows. A global clock 224 is used to generate the slow clocks 184 and 184" of emulation boards A and B. Emulation board A generates slow clock 184 by dividing global clock 224 via DCM 222. Emulation board A sends its slow clock 184 to emulation board B where it is received as slow clock 184' with some propagation delay. Phase correction module 220 uses slow clock 184' as its phase reference and generates slow clock 184" by division from global clock 224 and in-phase with the original slow clock 184.

Figure 11:
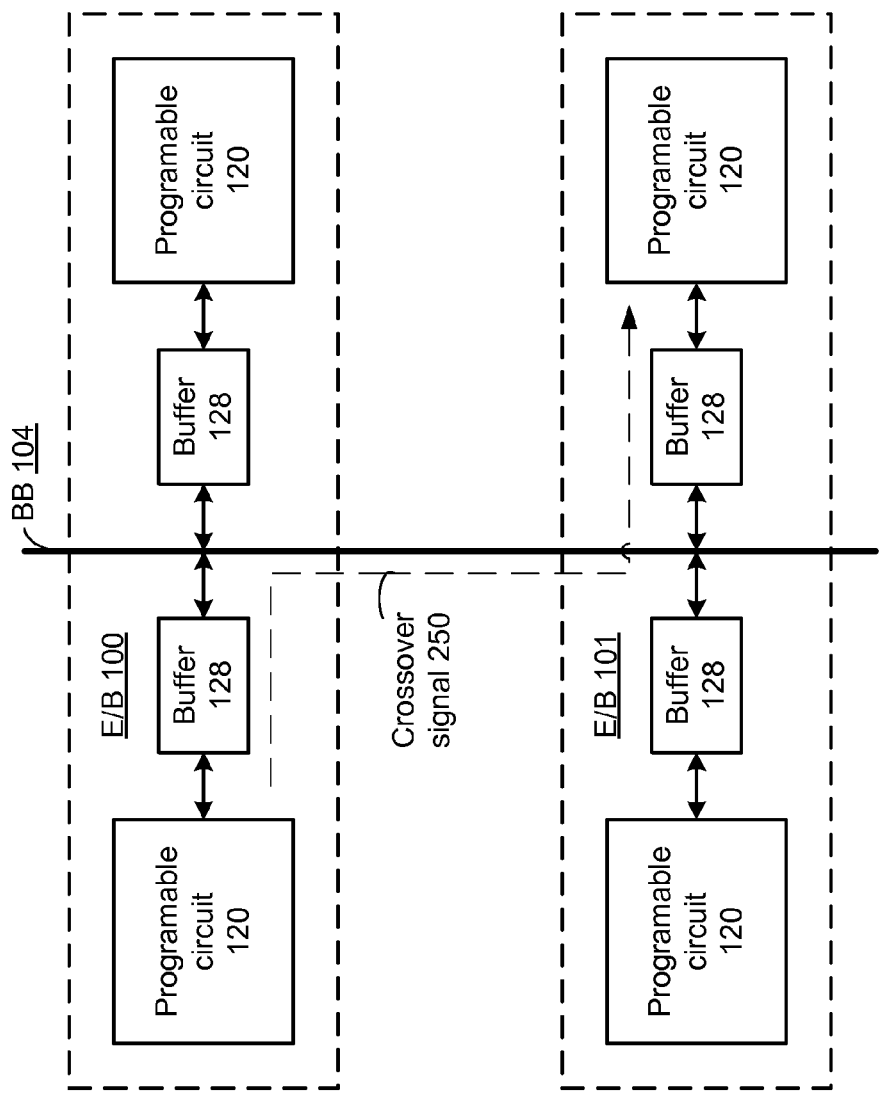
FIG. 11 presents a schematic block diagram representation of emulation boards 100 and 101 in accordance with an embodiment of the present invention.

FIG. 11 presents a schematic block diagram representation of emulation boards 100 and 101 in accordance with an embodiment of the present invention. In particular, two emulation boards 100 and 101 are illustrated as connected via broadcast bus 104. As discussed in conjunction with FIG. 1, the broadcast bus 104 is very different from the backplane described above. Its objective is to provide common connections between all programmable circuits 120 in the system. As the name suggests, broadcast signaling can originate from one FPGA and is received by all other FPGAs. There is no restriction on which FPGA initiates a broadcast message. Broadcast bus signals are also useful in situations where a "crossover" signal is required. This is the most efficient way to provide access from one programmable circuit 120 on an emulation board to a FPGA on the opposite side of a different board that are not directly connected via the system backplane 106.

As illustrated crossover signal 250 is broadcast from a programmable circuit 120 on one side of emulation board 100 to the programmable circuit 120 on the other side of the emulation board 101. The crossover signal 250 can include commands, I/O or other data to be communicated. In an embodiment of the present invention crossover signals 250 can include addressing that identifies that a particular destination board—in this case emulation board 101. While the crossover signal 250 is broadcast and received by all of the other programmable circuits 120 of the system, the crossover signal 250 is only read by the particular programmable circuit 120 having an address that matches the destination address of the crossover signal 250.

It should be noted that while the programmable circuit 120 has been described primarily as a FPGA, a programmable logic array or other programmable circuit (with suitable clock division capabilities to implement clock synchronization) can likewise be used to implement each of these devices.

While particular combinations of various functions and features of the present invention have been expressly described herein, other combinations of these features and functions are possible that are not limited by the particular examples disclosed herein are expressly incorporated in within the scope of the present invention.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As the term module is used in the description of the various embodiments of the present invention, a module includes a functional block that is implemented in hardware, software, and/or firmware that performs one or more module functions such as the processing of an input signal to produce an output signal. As used herein, a module may contain submodules that themselves are modules.

Thus, there has been described herein an apparatus and method, as well as several embodiments including a preferred embodiment, for implementing a modular emulation system. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A modular circuit comprising:
a global clock generator, that generates a plurality of clock signals including a fast clock and a slow clock, wherein the slow clock is slower than the fast clock; and
a plurality of circuit portions, coupled to the global clock generator, each of the circuit portions including at least one programmable circuit and a phase correction module that receives the fast clock and the slow clock and generates a recovered slow clock that is edge-aligned based on the fast clock and that is phase-aligned based on the slow clock.

2. The modular circuit of claim 1, wherein the phase correction module includes:
a digital clock manager that generates a divided clock that is edge-aligned to the fast clock;
a control unit, coupled to the digital clock manager that compares the phase of the divided clock to the slow clock and accepts the divided clock as the recovered slow clock when the phase of the divided clock compares favorably to the slow clock.

3. The modular circuit of claim 2, wherein the control unit determines the divided clock compares favorably to the slow clock when a phase of the divided clock differs from a phase of the slow clock by less than a phase threshold.

4. The modular circuit of claim 3, wherein the phase threshold indicates a maximum propagation delay of the slow clock.

5. The modular circuit of claim 2, wherein the digital clock manager generates the divided clock by frequency dividing the fast clock.

6. The modular circuit of claim 1, further comprising:
a system backplane, coupled to the plurality of circuit portions and the global clock generator, that carries serialized data produced by a serialization module of the at least one programmable circuit of one of the plurality of circuit portions boards to the at least one programmable circuit of another one of the plurality of circuit portions.

7. The modular circuit of claim 6,
wherein the serialization module generates the serialized data based on the fast clock and the slow clock.

8. The modular circuit of claim 7 wherein a deserialization module of the at least one programmable circuit of the another one of the plurality of circuit portions deserializes the communication received from the serialization module based on the fast clock and the recovered slow clock.

9. The modular circuit of claim 6, wherein the system backplane includes a plurality of zero delay analog switches for selectively coupling the plurality of circuit portions.

10. The modular circuit of claim 1 wherein at least one of the plurality of circuit portions includes:
a local clock generator for clocking the at least one programmable circuit of the at least one of the plurality of circuit portions.

11. A modular circuit comprising:
a global clock generator, that generates a plurality of clock signals including a fast clock and a slow clock, wherein the slow clock is slower than the fast clock; and
a plurality of circuit portions, coupled to the global clock generator, each of the circuit portions including at least one programmable circuit and a phase correction module that receives the fast clock and the slow clock and generates a recovered slow clock that is edge-aligned based on the fast clock and that is phase-aligned based on the slow clock; and
a system backplane, coupled to the plurality of circuit portions and the global clock generator, that carries serialized data produced by a serialization module of the at least one programmable circuit of one of the plurality of circuit portions to the at least one programmable circuit of another one of the plurality of circuit portions.

12. The modular circuit of claim 11, wherein the phase correction module includes:
a digital clock manager that generates a divided clock that is edge-aligned to the fast clock:
a control unit, coupled to the digital clock manager that compares the phase of the divided clock to the slow clock and accepts the divided clock as die recovered slow clock when the phase of the divided clock compares favorably to the slow clock.

13. The modular circuit of claim 12, wherein the control unit determines the divided clock compares favorably to the slow clock when a phase of the divided clock differs from a phase of the slow clock by less than a phase threshold.

14. The modular circuit of claim 12 wherein the digital clock manager generates the divided clock by frequency dividing the fast clock and wherein at least one of the plurality of circuit portions includes a local clock generator for clocking the at least one programmable circuit of the at least one of the plurality of circuit portions.

15. The modular circuit of claim 11,
wherein the serialization module generates the serialized data based on the fast clock and the slow clock.

16. The modular circuit of claim 15 wherein a deserialization module of the al least one programmable circuit of the another one of the plurality of circuit portions deserializes the communication received from the serialization module based on the fast clock and the recovered slow clock.

\* \* \* \* \*